(12) United States Patent
Pavlichek

(10) Patent No.: US 6,873,560 B2
(45) Date of Patent: Mar. 29, 2005

(54) OPTICAL MEMORY DEVICE

(76) Inventor: Paul D. Pavlichek, 1201 Longbow Rd., Mount Airy, MD (US) 21771

( * ) Notice: Subject to any disclaimer, the term of this patent is extended or adjusted under 35 U.S.C. 154(b) by 197 days.

(21) Appl. No.: 10/251,823

(22) Filed: Sep. 23, 2002

(65) Prior Publication Data

US 2004/0057314 A1 Mar. 25, 2004

(51) Int. Cl.[7] .............................. G11C 13/04; G11C 7/00
(52) U.S. Cl. ........................ 365/215; 365/64; 365/114
(58) Field of Search ................................. 365/215, 234, 365/64, 114

(56) References Cited

U.S. PATENT DOCUMENTS

| | | | |
|---|---|---|---|
| 4,238,803 A | 12/1980 | Terao et al. ................... | 346/1.1 |
| 4,727,528 A | 2/1988 | Wyland ......................... | 369/33 |
| 4,877,952 A | 10/1989 | Halemane et al. ........... | 250/213 A |
| 5,095,200 A | 3/1992 | Matsuda et al. .............. | 250/213 A |
| 5,199,087 A | 3/1993 | Frazier .......................... | 385/14 |
| 5,233,556 A | 8/1993 | Matsuda et al. .............. | 365/112 |
| 5,315,105 A | 5/1994 | Matsuda et al. ............ | 250/214 LS |
| 5,326,660 A | 7/1994 | Parkinson ...................... | 430/19 |
| 5,381,362 A | 1/1995 | Shen et al. .................... | 364/825 |
| 5,392,272 A | 2/1995 | Parkinson ..................... | 369/100 |
| 5,951,627 A | 9/1999 | Kiamilev et al. ............ | 708/404 |
| 6,005,791 A | 12/1999 | Gudesen et al. .............. | 365/114 |
| 6,064,615 A | 5/2000 | Gudesen ....................... | 365/215 |
| 6,128,110 A | 10/2000 | Bulow .......................... | 359/108 |
| 6,136,457 A | 10/2000 | Miyano et al. ............... | 428/693 |
| 6,147,889 A | 11/2000 | Weitzel ......................... | 365/10 |
| 6,172,926 B1 | 1/2001 | Drayer ......................... | 365/215 |
| 6,219,160 B1 | 4/2001 | Nordal et al. ................ | 359/107 |
| 6,307,779 B1 | 10/2001 | Roohparvar ............ | 365/185.11 |
| 6,385,080 B1 | 5/2002 | Heller et al. .................. | 365/151 |
| 6,392,914 B1 | 5/2002 | Kuroki et al. ................ | 365/118 |

FOREIGN PATENT DOCUMENTS

JP      2000-322534      11/2000

*Primary Examiner*—Son T. Dinh
(74) *Attorney, Agent, or Firm*—Richard C. Litman

(57) ABSTRACT

An optical memory device includes a plurality of optical memory cells, at least one wavelength filter, at least one read/write/erase filter, and a plurality of optical strands, wherein each optical memory cell stores and transmits data in optical form. The optical memory device interacts with an array of photon detectors, an array of lasers, and at least one central processing unit. A method of optically storing data in an optical memory device includes providing an optical memory device including a plurality of optical memory cells, at least one wavelength filter, at least one read/write/erase filter, and a plurality of optical strands; and storing and transmitting data in optical form in at least one of the plurality of optical memory cells.

20 Claims, 6 Drawing Sheets

OPTICAL MEMORY DEVICE

BACKGROUND OF THE INVENTION

1. Field of the Invention

The present invention relates generally to optical memory devices and, more particularly, to an optical memory device that can store and transmit data in a purely optical form.

2. Description of the Related Art

Optics has long been considered superior to electronics in computer processing intensive applications. Next generation optical computers require a need for faster memory. There is a move in the networking and switching industries to start doing purely optical transfer of data. But the stopping points in these technologies is the fact that data must be changed from an optical medium to an electronic medium in order for the data to be processed, buffered, and stored. This creates a bottleneck in the data flow process.

Ideally, in an end to end optical data flow, data would stay in its optical format from beginning to end. To accomplish this, there needs to be an advancement in the technologies of optical processors and optical memory. The present invention concerns optical memory.

Current applications of optical memory revolve around compact disc (CD) technology. A laser is used to create pits on a reflective disc. These pits represent the stored data in standard binary form When data retrieval is required a laser is reflected off of the disc while it is spinning. Spinning provides access to all sectors of the disc so that data can be stored in locations outside the range of the laser. This idea originated with magnetic storage of information on removable disc and hard disc devices.

The problems inherent in the use of CDs for storage of data in an optical computer have to do with the slow access times involved with writing and retrieving. To write to a CD the data must be buffered, in a conventional electronic storage device, before being written. Then when accessing the data it must be buffered again before being used by the random access memory and the processor. This puts it in the realm of long term storage medium.

There is also the issue of having moving parts in a computer device. Anything that moves will eventually breakdown due to wear and tear from long term usage. Current hard drive technology is limited because of the same reason. A magnetic disc is spun to all sectors of the drive. Friction from use will eventually bring an end of life to the drive and the possible loss of data that was stored.

There are a number of references that deal with new concepts for optical storage. Many of them still rely on the changing of optical data into electrical data. Others still rely on the idea of spinning a disc in the old CD fashion. Others combine the two ideas. The related art is represented by the following references of interest.

U.S. Pat. No. 4,238,803, issued on Dec. 9, 1980 to Motoyasu Terao et al., describes information recording methods using lasers that require the buffering of data on conventional storage media, thus slowing the process while reading and writing. Terao et al. does not suggest an optical memory device according to the claimed invention.

U.S. Pat. No. 4,727,528, issued on Feb. 23, 1988 to David C. Wyland, describes an optical data read/write apparatus for use in reading a rotating optical disc having at least one concentric reference track and circular data tracks thereon. Wyland does not suggest an optical memory device according to the claimed invention.

U.S. Pat. No. 4,877,952, issued on Oct. 31, 1989 to Thirumala R. Halemane et al., describes an optical memory device in which data is written, stored, and read out in optical form without any conversion to electronics. Halemane et al. does not suggest an optical memory device according to the claimed invention.

U.S. Pat. No. 5,095,200, issued on Mar. 10, 1992 to Kenichi Matsuda et al., describes an optoelectronic memory, logic, and interconnection device having an optical bistable circuit as an essential element. Matsuda et al. '200 does not suggest an optical memory device according to the claimed invention.

U.S. Pat. No. 5,199,087, issued on Mar. 30, 1993 to Gary A. Frazier, describes an optoelectronic integrated circuit chip. Frazier does not suggest an optical memory device according to the claimed invention.

U.S. Pat. No. 5,233,556, issued on Mar. 10, 1992 to Kenichi Matsuda et al., describes an optoelectronic memory and logic device that has a function of a reset-set flip flop or an exclusive-OR gate. Matsuda et al. '556 does not suggest an optical memory device according to the claimed invention.

U.S. Pat. No. 5,315,105, issued on May 24, 1994 to Kenichi Matsuda et al., describes an optical operational memory device including first and second phototransistors, and a load resistor. Matsuda et al. '105 does not suggest an optical memory device according to the claimed invention.

U.S. Pat. No. 5,326,660, issued on Jul. 5, 1994 to Dean B. Parkinson, describes an optical recording structure including a thermally stable structure and a polymeric layer deposited on the substrate comprised of a poly(ester-amide). Parkinson '660 does not suggest an optical memory device according to the claimed invention.

U.S. Pat. No. 5,381,362, issued on Jan. 10, 1995 to Xiao An Shen et al., describes a high-speed, high-throughput matched optical filter that allows ro rapid reprogramming to change the reference signal or signals. Shen et al. does not suggest an optical memory device according to the claimed invention.

U.S. Pat. No. 5,392,272, issued on Feb. 21, 1995 to Dean B. Parkinson, describes an erasable data storage medium which provides its recording mark or bump by transforming from one morphological state to another upon heating. Parkinson '272 does not suggest an optical memory device according to the claimed invention.

U.S. Pat. No. 5,951,627, issued on Sep. 14, 1999 to Fouad E. Kiamilev et al., describes an apparatus for calculating a fast Fourier transform for a plurality of data points in a plurality of stages. Kiamilev et al. does not suggest an optical memory device according to the claimed invention.

U.S. Pat. No. 6,005,791, issued on Dec. 21, 1999 to Hans Gude Gudesen et al., describes a proximity-addressable optical logic element. Gudesen et al. does not suggest an optical memory device according to the claimed invention.

U.S. Pat. No. 6,064,615, issued on May 16, 2000 to Hans Gude Gudesen, describes an optical memory element wherein data are written and read by light incident to the memory element. Gudesen does not suggest an optical memory device according to the claimed invention.

U.S. Pat. No. 6,128,110, issued on Oct. 3, 2000 to Jeffrey A. Bulow, describes a programmable optical logic gate. Bulow does not suggest an optical memory device according to the claimed invention.

U.S. Pat. No. 6,136,457, issued on Oct. 24, 2000 to Kenjiro Miyano et al., describes a manganese oxide material that can be used as a switching device or as a memory device. Miyano et al. does not suggest an optical memory device according to the claimed invention.

U.S. Pat. No. 6,147,889, issued on Nov. 14, 2000 to Thilo Weitzel, describes a device for the optical recording, storage, and readout of information. Weitzel does not suggest an optical memory device according to the claimed invention.

U.S. Pat. No. 6,172,926 B1, issued on Jan. 9, 2001 to Phillip M. Drayer, describes an optical storage element for storing data as a packet of photons. Drayer does not suggest an optical memory device according to the claimed invention.

U.S. Pat. No. 6,219,160 B1, issued on Apr. 17, 2001 to Per-Erik Nordal et al., describes a multistable optical logic element which undergoes a photo'cycle with several physical states by irradiation with light. Nordal et al. does not suggest an optical memory device according to the claimed invention.

U.S. Pat. No. 6,307,779 B1, issued on Oct. 23, 2001 to Frankie F. Roohparvar, describes a synchronous non-volatile flash memory. Roohparvar does not suggest an optical memory device according to the claimed invention.

U.S. Pat. No. 6,385,080 B1, issued on May 7, 2002 to Michael J. Heller et al., describes an optical memory system that includes memory cells which utilize synthetic DNA as a component of the information storage mechanism. Heller et al. does not suggest an optical memory device according to the claimed invention.

U.S. Pat. No. 6,392,914 B1, issued on May 21, 2002 to Yoshihiko Kuroki et al., describes a nonlinear coupling oscillator array including two layers in each of which a number of quantum dots as oscillators are arranged two-dimensionally are laid one on another. Kuroki et al. does not suggest an optical memory device according to the claimed invention.

Japan Patent document 2000-322534, published on Nov. 24, 2000, describes an optical recording medium including a memory device and an antenna structure. Japan '534 does not suggest an optical memory device according to the claimed invention.

None of the above inventions and patents, taken either singularly or in combination, is seen to describe the instant invention as claimed. Thus an optical memory device solving the aforementioned problems is desired.

SUMMARY OF THE INVENTION

The present invention is an optical memory device that records, stores, and/or erases data in an optical manner using no conversion to electronic format. The optical memory device includes a plurality of optical memory cells, at least one wavelength filter, at least one read/write/erase filter, and a plurality of optical strands. The optical memory device interacts with an array of photon detectors, at least one array of laser, and at least one central processing unit (CPU). The optical memory device includes a crystal cell structure with a plurality of optical memory cells. The crystal cell structure includes optical input and output leads. The optical input and output leads ensure that individual photon data streams move into and out of the crystal cell structure properly. Each optical memory cell is associated with a wavelength filter and a read/write/erase filter.

The optical memory cells are composed of photonic band gap materials that control the propagation of electromagnetic radiation by creating periodic dielectric structures. Since photonic crystals include periodicity in one, two, or three directions, they can be used to control the direction and wavelength of photon streams. The wavelength filter takes advantage of technologies that include dielectric interference filters and interference mirrors and optics to allow the passage of a single wavelength and prohibit the transmission of other wavelengths. The read/write/erase filter utilizes nanocrystal technology to create structures that are sensitive to predetermined wavelengths in order to store and erase data.

For a read signal, a photon data stream passes through an optical lead, a wavelength filter, and a read/write/erase filter. For a write or erase signal, a photon data stream passes through an optical lead and interacts with a read/write/erase filter. The wavelength filter allows photon data streams having wavelengths within a predetermined wavelength range to pass through. The read/write/erase filter interacts with photon data streams having wavelengths within a predetermined wavelength range.

The read/write/erase filters initially start in a neutral or relaxed state. Photon data streams entering optical memory cells for storage are in standard binary format. In order to write to an optical memory cell, photon detectors and lasers in a laser array flip ones and zeros to their alternate state. Ones become zeros and generate a wavelength that will cause tension to the read/write/erase filter, thereby prohibiting the transmission of wavelengths generated for the purpose of reading stored data. Zeros become ones generating no photon data stream and leaving the read/write/erase filter in a neutral state. This would allow a photon data stream generated to read stored data to pass through and establish a one bit. A second memory device following the same set of procedures may be utilized to change the data back to its proper original state of ones and zeros. Erasing flushes the read/write/erase filter of tension and returns it to a relaxed state.

Optical strands provide passage of photon data streams transmitted from a laser array that interacts with the optical memory device. To read stored data a photon data stream broadcast is used to check the state of every filter. Photon data streams that pass the wavelength and read/write/erase filters are relayed to an outgoing photon detector array that interacts with the optical memory device.

In order to write or erase data photon data streams pass through an array of optical strands to the read/write/erase filters. These arrays lead to the read/write/erase filters corresponding to the wavelength layers of the optical memory device as requested by the CPU. Photon data streams for writing and/or erasing interact with the read/write/erase filters outgoing data that have been read passes through these optical strands as well. These optical arrays lead to an outgoing photon detector array that interacts with the optical memory device.

Lasers interacting with the optical memory device perform three operations. They transmit photon data streams that read data, write data, and erase data. Reading data occurs by photon data stream transmission from a laser in one direction. This may be done utilizing multiple wavelengths in order to read data on multiple layers of the optical memory device. Writing and erasing data occurs by photon transmission from a laser in an opposite direction. Photon transmissions for writing and erasing occur at two different wavelengths. These wavelengths are used to apply tension to filters and to relax filters during the write and erase processes. A third laser may be used to change outgoing read data into a single wavelength depending on processor applications.

A method for optically storing data in an optical memory device includes providing an optical memory device including a plurality of optical memory cells, at least one wavelength filter, at least one read/write/erase filter, and a plurality of optical strands; and storing and transmitting data in optical form in at least one of the plurality of optical memory cells.

The method may also include allowing passage of photon data streams having wavelengths within a predetermined wavelength range through the at least one wavelength filter, reading data by passing photon data streams through the at least one read/write/erase filter and determining a bit state dependent on whether the photon data streams pass through the at least one read/write/erase filter, allowing passage of photon data streams having wavelengths within a predetermined wavelength range through the at least one read/write/erase filter, storing data in at least one of the plurality of optical memory cells by changing the density of the at least one read/write/erase filter by absorbing a photon data stream having a first wavelength within a first predetermined wavelength range, erasing data in at least one of the plurality of optical memory cells by changing the density of the at least one read/write/erase filter by absorbing a photon data stream having a second wavelength within a second predetermined wavelength range, addressing optical memory cells as instructed by a central processing unit, addressing optical memory cells using multiple wavelengths, transporting incoming data for multiple wavelengths on an individual optical lead, and/or recombining data from multiple wavelengths into a single wavelength for use by other optical processing devices.

Accordingly, it is a principal aspect of the invention to provide an optical memory device including a plurality of optical memory cells, at least one wavelength filter, at least one read/write/erase filter, and a plurality of optical strands, wherein each optical memory cell stores and transmits data in optical form.

It is another aspect of the invention to provide an optical memory device including a plurality of optical memory cells, at least one wavelength filter, at least one read/write/erase filter, and a plurality of optical strands, wherein each optical memory cell stores and transmits data in optical form, and wherein the wavelength filter allows passage of photon data streams having wavelengths within a predetermined wavelength range.

It is a further aspect of the invention to provide an optical memory device including a plurality of optical memory cells, at least one wavelength filter, at least one read/write/erase filter, and a plurality of optical strands, wherein each optical memory cell stores and transmits data in optical form, and wherein the wavelength filter allows passage of photon data streams having wavelengths within a predetermined wavelength range and reads data by passing photon data streams through a read/write/erase filter and determining a bit state dependent on whether the photon data streams pass through the read/write/erase filter.

Still another aspect of the invention is to provide an optical memory device including a plurality of optical memory cells, at least one wavelength filter, at least one read/write/erase filter, and a plurality of optical strands, wherein each optical memory cell stores and transmits data in optical form, and wherein the read/write/erase filter interacts with photon data streams having wavelengths within a predetermined wavelength range, and writes data by changing the density of the read/write/erase filter by absorbing a photon data stream having a first wavelength within a predetermined wavelength range, and erases data by changing the density of the read/write/erase filter by absorbing a photon data stream having a second wavelength in a predetermined wavelength range.

Yet another aspect of the invention is to provide a method of optically storing data in an optical memory device, the method including providing an optical memory device including a plurality of optical memory cells, at least one wavelength filter, at least one read/write/erase filter, and a plurality of optical strands; and storing and transmitting data in optical form in at least one of the plurality of optical memory cells.

Still another aspect of the invention is to provide a method of optically storing data in an optical memory device, the method including providing an optical memory device including a plurality of optical memory cells, at least one wavelength filter, at least one read/write/erase filter, and a plurality of optical strands, storing and transmitting data in optical form in at least one of the plurality of optical memory cells, allowing passage of photon data streams having wavelengths within a predetermined wavelength range through the at least one wavelength filter, reading data by passing photon data streams through the at least one read/write/erase filter and determining a bit state dependent on whether the photon data streams pass through the at least one read/write/erase filter, allowing passage of photon data streams having wavelengths within a predetermined wavelength range through the at least one read/write/erase filter, storing data in at least one of the plurality of optical memory cells by changing the density of the at least one read/write/erase filter by absorbing a photon data stream having a first wavelength within a first predetermined wavelength range, erasing data in at least one of the plurality of optical memory cells by changing the density of the at least one read/write/erase filter by absorbing a photon data stream having a second wavelength within a second predetermined wavelength range, addressing optical memory cells as instructed by a central processing unit, addressing optical memory cells using multiple wavelengths, transporting incoming data for multiple wavelengths on an individual optical lead, and/or recombining data from multiple wavelengths into a single wavelength for use by other optical processing devices.

It is an aspect of the invention to provide improved elements and arrangements thereof in an optical memory device for the purposes described which is inexpensive, dependable and fully effective in accomplishing its intended purposes.

These and other aspects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
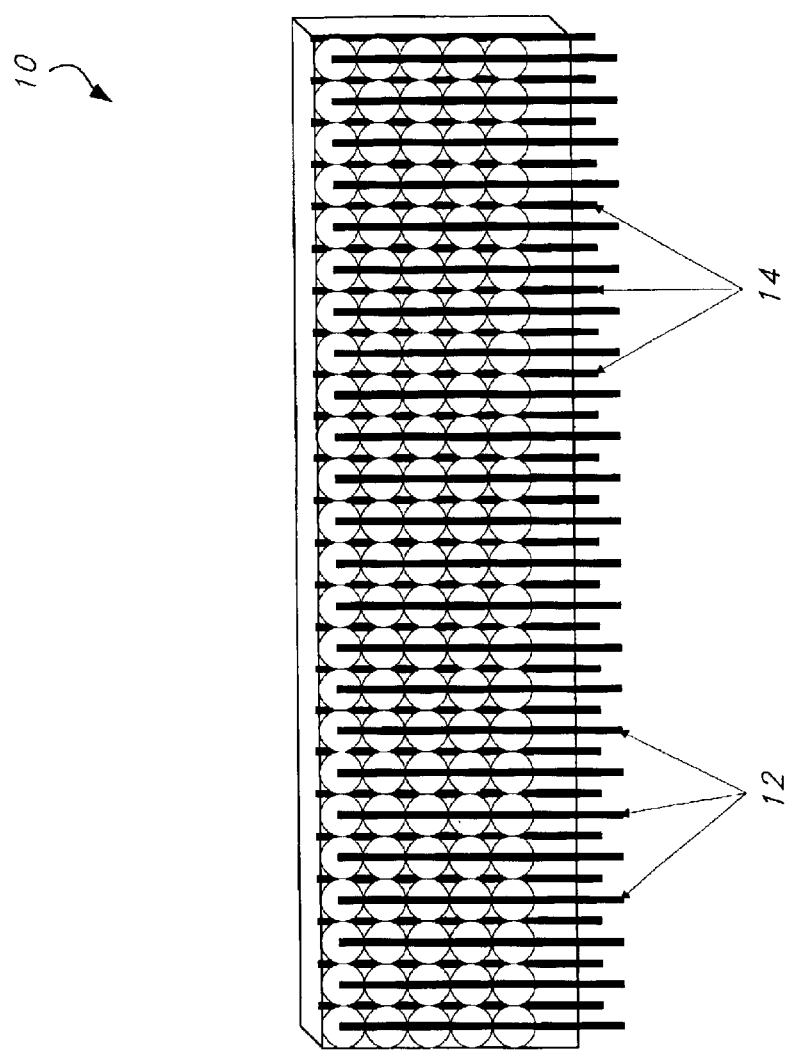
FIG. 1 is a front perspective view of a crystal cell structure according to the present invention.

The present invention is an optical memory device. The invention disclosed herein is, of course, susceptible of embodiment in many different forms. Shown in the drawings and described hereinbelow in detail are preferred embodiments of the invention. It is to be understood, however, that the present disclosure is an exemplification of the principles of the invention and does not limit the invention to the illustrated embodiments.

Figure 2:
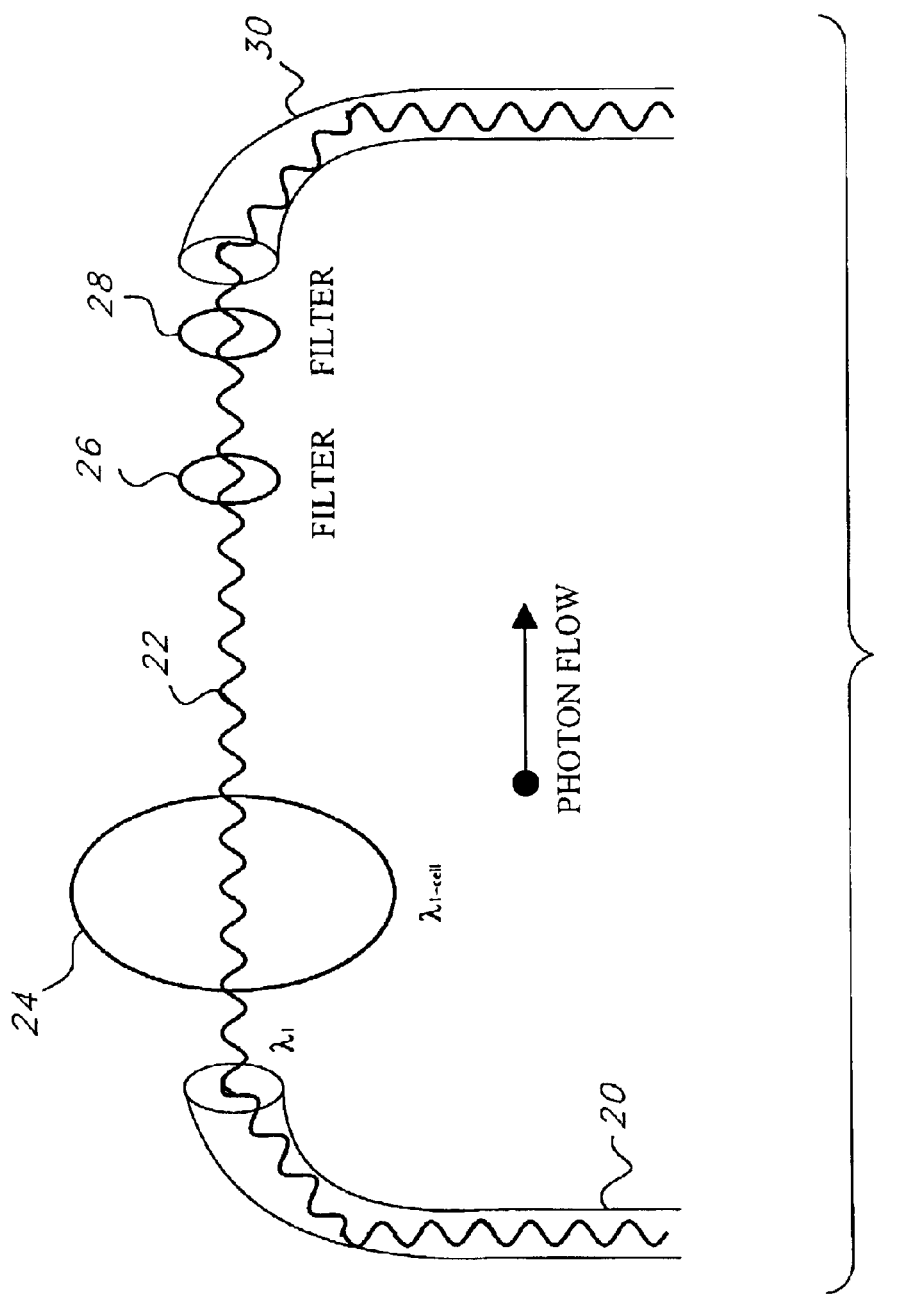
FIG. 2 is a side perspective view of a photon wavelength passing through an optical channel, a wavelength filter, and a read/write/erase filter according to the present invention.
Figure 3:
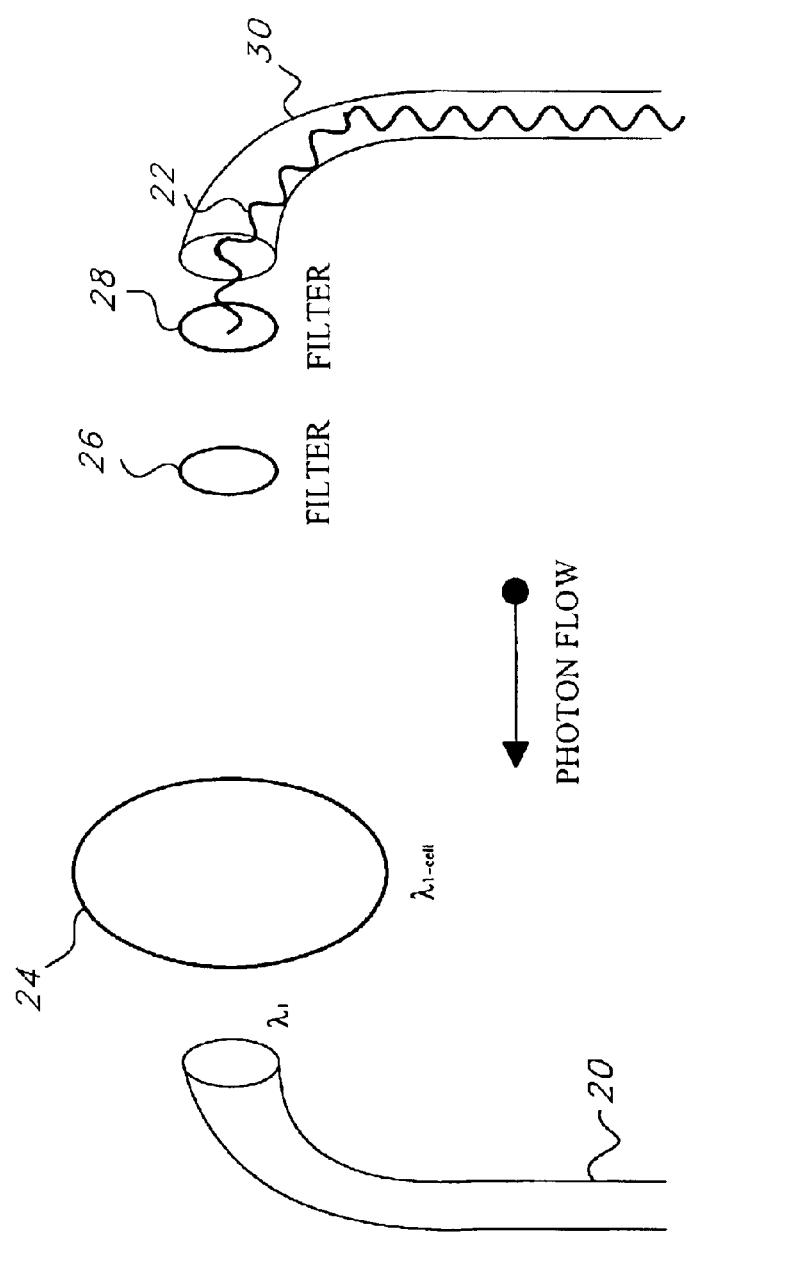
FIG. 3 is a side perspective view of a photon wavelength passing through an optical channel and interacting with a read/write/erase filter according to the present invention.

Referring to the drawings, FIG. 1 illustrates a crystal cell structure 10 of an optical memory device according to the invention. Crystal cell structure 10 includes optical leads 12 and 14. Optical leads 12 and 14 ensure that individual photon data streams move into and out of crystal cell structure 10 properly. FIGS. 2 and 3 illustrate a photon data stream 22 passing through an optical channel of the crystal cell structure 10 shown in FIG. 1.

Optical memory cell 24 is associated with a wavelength filter 26 and a read/write/erase filter 28 and is composed of photonic band gap materials that control the propagation of electromagnetic radiation by creating periodic dielectric structures. Since photonic crystals include periodicity in one, two, or three directions depending on their structures, they can be used to control the direction and wavelength of photon streams. Wavelength filter 26 takes advantage of technologies that include dielectric interference filters and interference mirrors and optics to allow the passage of a single wavelength and prohibit the transmission of other wavelengths. Read/write/erase filter 28 utilizes nanocrystal technology to create structures that are sensitive to predetermined wavelengths in order to store and erase data.

For a read signal, a photon data stream 22 transmitted by an external laser array (not shown) passes through optical lead 20, wavelength filter 26, and read/write/erase filter 28 (see FIG. 2). For a write or erase signal, a photon data stream 22 transmitted by an external laser array (not shown) passes through optical lead 30 and interacts with read/write/erase filter 28 (see FIG. 3). Wavelength filter 26 allows photon data streams having wavelengths within a predetermined wavelength range to pass through. Read/write/erase filter 28 interacts with photon data streams having wavelengths within a predetermined wavelength range. For example, wavelength filter 26 may be configured to allow photon data streams having wavelengths within the range of 390 nm and 780 nm to pass through, and read/write/erase filter 28 may be configured to interact with photon data streams having wavelengths lower than 390 nm or greater than 780 nm.

Read/write/erase filter 28 initially starts in a neutral or relaxed state. Data in the photon data stream 22 entering optical memory cell 24 for storage is in standard binary format. In order to write to optical memory cell 24 a laser array flips the ones and zeroes to their alternate state. Ones become zeros and generate a wavelength that will cause tension to read/write/erase filter 28. Zeros become ones generating no photon data stream and leaving read/write/erase filter 28 in a neutral state. A second memory device following the same set of procedures may be utilized to change the data back to its proper original state of ones and zeros. Erasing flushes read/write/erase filter 28 of tension and returns it to a relaxed state.

Optical strands 20 and 30 provide passage of photon data streams transmitted from a laser array (not shown) that interacts with the optical memory device. Photon data streams passing through optical strand 20 perform the read function. To read stored data a photon data stream broadcast is used to check the state of every filter. Photon data streams that pass filters 26 and 28 are relayed to an outgoing photon detector array (not shown) that interacts with the optical memory device.

Photon data streams passing through an array of optical strands 30 perform the write/erase function. In order to write or erase data photon data streams pass through an array of optical strands 30 to the read/write/erase filters 28. Photon data streams for writing and/or erasing interact with the read/write/erase filters 28. Outgoing data that have been read passes through these optical strands as well. These optical arrays lead to an outgoing photon detector array that interacts with the optical memory device.

The laser arrays interact with the optical memory device to perform three operations. They transmit photons that read data, write data, and/or erase data. Reading data occurs by photon transmission from a laser in one direction. This may be done utilizing multiple wavelengths in order to read data on multiple layers of the optical memory device. Writing and/or erasing data occurs by photon data stream transmission from a laser in an opposite direction. Photon data stream transmissions for writing and/or erasing occurs at two different wavelengths. These wavelengths are used to apply tension to read/write/erase filters and to relax read/write/erase filters during the write and/or erase processes. A third laser may be used to change outgoing read data into a single wavelength depending on processor applications.

Figure 4:
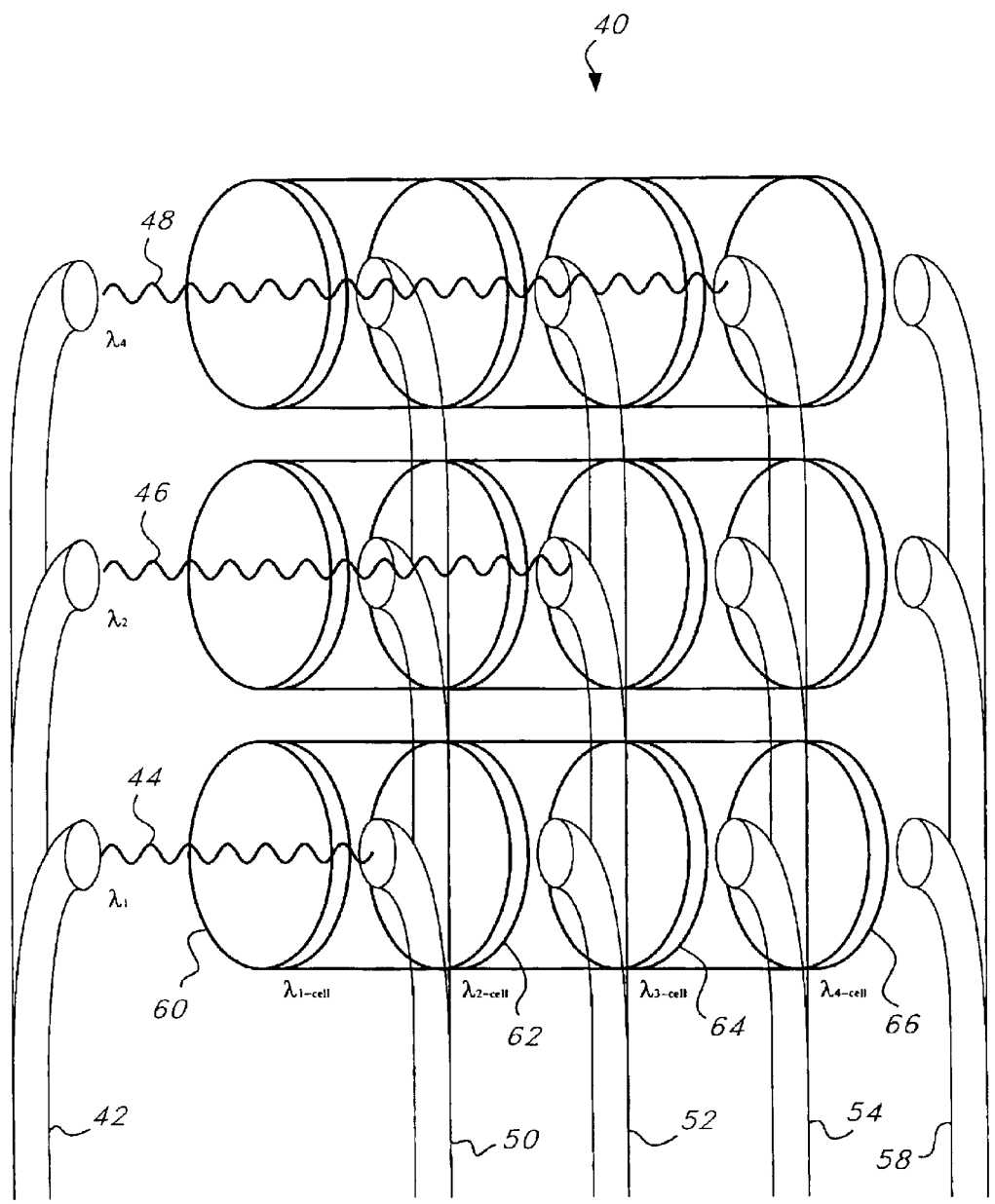
FIG. 4 is a side perspective view of photon wavelengths passing through optical channels in a crystal memory cell according to the present invention.
Figure 5:
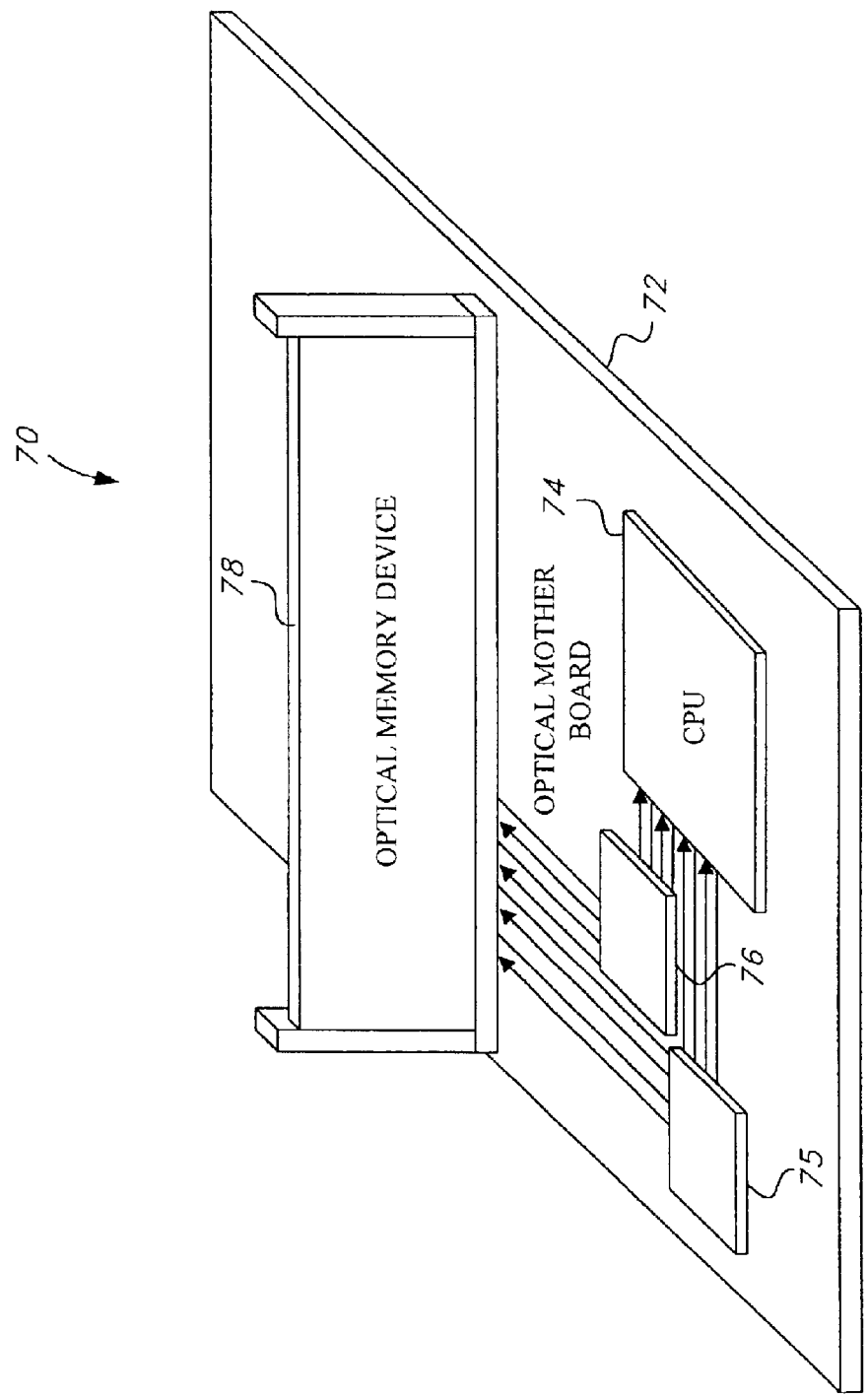
FIG. 5 is a front perspective view of a computer mother board upon which is mounted a CPU, a laser array, a photon detector array, and an optical memory chip according to the present invention.

FIG. 4 illustrates a plurality 40 of optical memory cells 60, 62, 64, and 66. Photon data streams 44, 46, and 48 pass through optical leads 42, 50, 52, and 54 and optical memory cells 60, 62, 64, and 66. FIG. 5 illustrates an optical processing arrangement 70. Optical processing arrangement 70 includes optical processing motherboard 72 upon which is mounted CPU 74, laser array 75, photon detector array 76, and optical memory device 78. CPU 74, laser array 75, photon detector array 76, and optical memory device 78 are optically interconnected with one another.

Optical memory device 78 has a crystal layer formation that includes optical leads and optical memory cells. The optical memory cells are each associated with wavelength filters and read/write/erase filters. The crystal layers are configured to allow easy access by optical leads. The crystal layers direct photon data stream flow through optical memory device 78 and separate photon data streams into the optical memory cell corridors. With multiple layers of optical memory cells matching up through the crystal structure the optical memory cell corridors maintain photon data stream flow and data integrity.

The optical memory cells are separated from each other by the wavelength and read/write/erase filters. The wavelength and read/write/erase filters allow for access of stored data on each optical memory cell of optical memory chip 78. By using multiple wavelengths and filters that allow for passing of individual wavelengths, the data at each optical memory cell is not confused with other optical memory cells. This allows for high speed multiplexing and demultiplexing of incoming and outgoing optical data. On the backside of each optical memory cell is a read/write/erase filter. The read/write/erase filter is the mechanism by which data is stored in the optical memory cell. The density of the filters can be altered through the interaction of photon streams. This density change inhibits the ability of filters to allow photon data streams that are reading data from passing through them.

In order to control the direction and destination of the photon data streams entering and leaving the optical memory chip, a series of optical leads are used. The optical leads start at a laser array on the read side of the optical memory chip. This set of leads directs photon data streams to the proper crystal sectors and corridors depending on the address space requested.

After passing through the crystal layer formation, the wavelength filters, and the read/write/erase filters, an optical lead directs the photon data streams to an exit laser array. This set of optical leads, because of their position, directs read/write/erase photon streams to the read/write/erase filters.

When performing the read/write/erase process, photon data streams interact with laser array 75, which generates the proper wavelength photon data stream and sends it to the proper set of optical leads. These optical leads then direct the photon data streams to the read/write/erase filters. Data that has been read are directed to photon detector array 76 that either consolidates the wavelengths or leaves them in their current form, depending on requirements, and then forwards them to their next destination.

Figure 6:
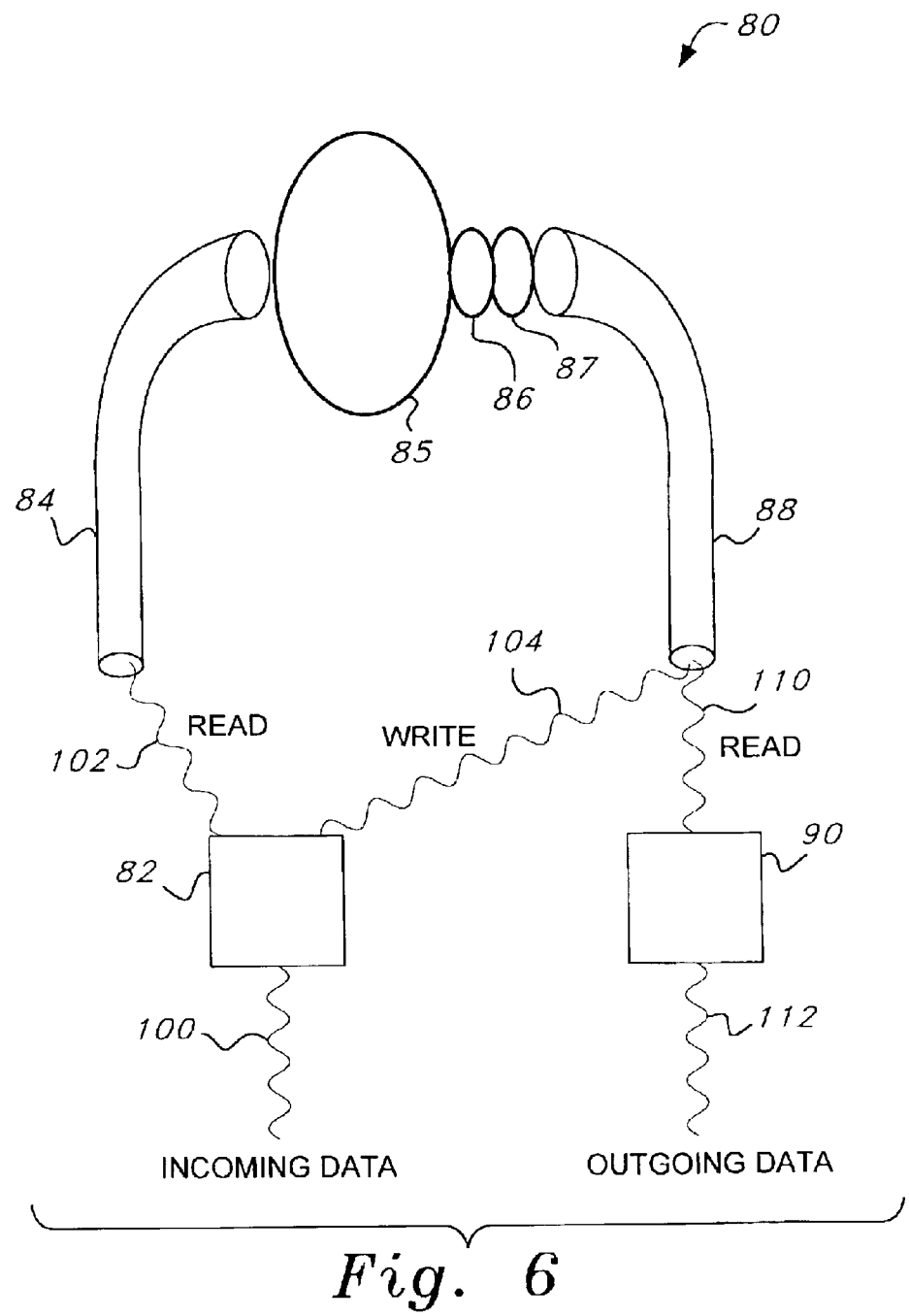
FIG. 6 is a schematic diagram of read and write signals passing through an optical channel according to the present invention.

FIG. 6 illustrates an optical memory arrangement 80 that summarizes the passage of read, write, and/or erase signals. Initially, incoming data 100 interacts with a laser array 82. For a read signal, photon data stream 102 passes through optical lead 84, optical memory cell 85, wavelength filter 86, and read/write/erase filter 87. For a write or erase signal, photon data stream 104 passes through optical lead 88 and interacts with read/write/erase filter 87. Read photon data streams 110 that pass filters 86 and 87 are relayed to an outgoing photon detector array 112 that interacts with optical memory cell 85.

Two primary wavelengths perform the write and erase functions. To perform the read function a number of wavelengths equal to the number of crystal layers in the optical memory device are employed. These wavelengths may be designated as follows:

$\lambda_{r(1-1+N)}$=Read (corresponding layer number)
$\lambda_W$=Write
$\lambda_e$=Erase The presence or non-presence of a photon data stream determines binary data. The presence of a photon data stream determines a one in binary form. The non-presence of a photon data stream determines a zero. Since bits entering the device to be written are in this form they must be changed in order to cause action upon the photon detector and subsequently the filter.

A photon data stream representing a one will contact the photon detector and initiate the transmission of a photon data stream of wavelength $\lambda_W$ to interact with the filter. This causes the filter to take on a state of density that will not allow a photon data stream of $\lambda_r$ to pass the filter during the read process. This will produce a bit state of zero. A photon data stream representing a zero will have no effect on the photon detector. This will cause no action on the read/write/erase filter and result in a bit state of one. The writing of data is done through the backside of the crystal formation of the optical memory cell so that interaction only occurs with the read/write/erase filter.

To erase stored data on an optical memory cell a broadcast or flood of photon data streams using the wavelength $\lambda_e$ will be sent to all of the filters in a sector. This causes the filters to relax if storing data or have no action upon them if they are already in a relaxed state. This will cause an active state through out the storage sector and show as clean to receive new data for storage. These $\lambda_W$ and $\lambda_o$ data streams travel in a backward direction in the optical memory device. They are unaffected by wavelength filters due to the fact that their destination are read/write/erase filters.

An optical memory cell stores and transmits data through photon data streams. Minimal electronic conversion of information is required to read, write, or erase the data stored on the optical memory device. The optical memory device is built around crystal formations with surface areas that are sensitive to certain photonic wavelengths. These wavelengths can be used to create surface tension that will allow or inhibit the transmission of a photon data stream. When data needs to be retrieved, a photon data stream having a neutral wavelength can be sent resulting in the reading and transmission of stored data. When no longer needed, the surfaces can be flashed with a tension relieving wavelength, cleaning the crystals and allowing them to be reused. Since multiple wavelengths can be transmitted in a photon data stream, multiple layers of data can be stored and accessed on corresponding layers of crystal cells.

While the invention has been described with references to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

I claim:

1. An optical memory device comprising:
   a plurality of optical memory cells;
   at least one wavelength filter;
   at least one read/write/erase filter; and
   a plurality of optical strands;
   wherein each optical memory cell stores and transmits data in optical form.

2. The optical memory device according to claim 1, wherein said at least one wavelength filter allows passage of photon data streams having wavelengths within a predetermined wavelength range.

3. The optical memory device according to claim 1, wherein optical memory device reads data by passing photon data streams through the at least one read/write/erase filter and determining a bit state dependent on whether the photon data streams pass through the at least one read/write/erase filter.

4. The optical memory device according to claim 1, wherein said at least one read/write/erase filter allows passage of photon data streams having wavelengths within a predetermined wavelength range.

5. The optical memory device according to claim 4, wherein each of said plurality of optical memory cells stores data by changing the density of the at least one read/write/erase filter by absorbing a photon data stream having a first wavelength within a first predetermined wavelength range.

6. The optical memory device according to claim 5, wherein each of said plurality of optical memory cells erases data by changing the density of the at least one read/write/erase filter by absorbing a photon data stream having a second wavelength within a second predetermined wavelength range.

7. The optical memory device according to claim 1, wherein said optical memory device addresses optical memory cells as instructed by a central processing unit.

8. The optical memory device according to claim 7, wherein said optical memory device addresses optical memory cells using multiple wavelengths.

9. The optical memory device according to claim 8, wherein said optical memory device transports incoming data for multiple wavelengths on an individual optical lead.

10. The optical memory device according to claim 1, wherein said optical memory device recombines data from multiple wavelengths into a single wavelength for use by other optical processing devices.

11. A method for optically storing data in an optical memory device, the method comprising:

providing an optical memory device including a plurality of optical memory cells, at least one wavelength filter, at least one read/write/erase filter, and a plurality of optical strands; and storing and transmitting data in optical form in at least one of the plurality of optical memory cells.

12. The method according to claim 11, further comprising allowing passage of photon data streams having wavelengths within a predetermined wavelength range through the at least one wavelength filter.

13. The method according to claim 11, further comprising reading data by passing photon data streams through the at least one read/write/erase filter and determining a bit state dependent on whether the photon data streams pass through the at least one read/write/erase filter.

14. The method according to claim 11, further comprising allowing passage of photon data streams having wavelengths within a predetermined wavelength range through the at least one read/write/erase filter.

15. The method according to claim 11, further comprising storing data in at least one of the plurality of optical memory cell by changing the density of the at least one read/write/erase filter by absorbing a photon data stream having a first wavelength within a first predetermined wavelength range.

16. The method according to claim 15, further comprising erasing data in at least one of the plurality of optical memory cells by changing the density of the at least one read/write/erase filter by absorbing a photon data stream having a second wavelength within a second predetermined wavelength range.

17. The method according to claim 11, further comprising addressing optical memory cells as instructed by a central processing unit.

18. The method according to claim 17, further comprising addressing optical memory cells using multiple wavelengths.

19. The method according to claim 18, further comprising transporting incoming data for multiple wavelengths on an individual optical lead.

20. The method according to claim 11, further comprising recombining data from multiple wavelengths into a single wavelength for use by other optical processing devices.

* * * * *